United States Patent [19]

Merino

[11] 4,019,195
[45] Apr. 19, 1977

[54] SEMI-CONDUCTOR DEVICE CAPABLE OF SUPPORTING HIGH AMPERAGES OF INVERSE CURRENT

[75] Inventor: Elias Munoz Merino, Madrid, Spain

[73] Assignee: Fabrica Espanola Magnetos, S.A., Madrid, Spain

[22] Filed: July 3, 1975

[21] Appl. No.: 592,873

[30] Foreign Application Priority Data

Dec. 21, 1972 Spain ............... 409921

[52] U.S. Cl. .................. 357/13; 357/59; 357/89; 357/20; 357/60
[51] Int. Cl.² .............. H01L 29/90; H01L 29/04
[58] Field of Search ........... 357/13, 60, 88, 20, 357/89, 59

[56] References Cited

UNITED STATES PATENTS 3,436,282  4/1969  Shoda ............... 148/187

FOREIGN PATENTS OR APPLICATIONS 923,513  4/1963  United Kingdom ......... 357/13

*Primary Examiner*—Martin N. Edlow

[57] ABSTRACT

The present invention relates to a surge arrester or transient voltage clipper device comprising a quasi-monocrystalline semiconductor (silicon for instance), with an extra large etch pit density or low-angle boundary grains. At these dislocation lines the dopant is present in a larger concentration, and multiple $p^+$-$n^+$ junctions are formed preferentially at these grain boundaries as an external impurity of the opposite type to the background dopant is diffused preferentially through these dislocation lines.

4 Claims, 5 Drawing Figures

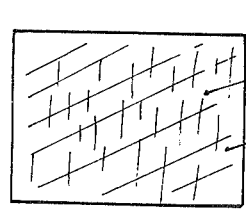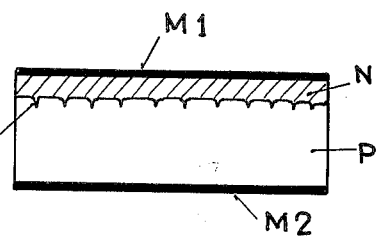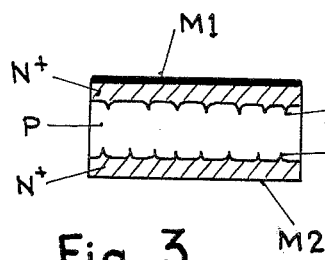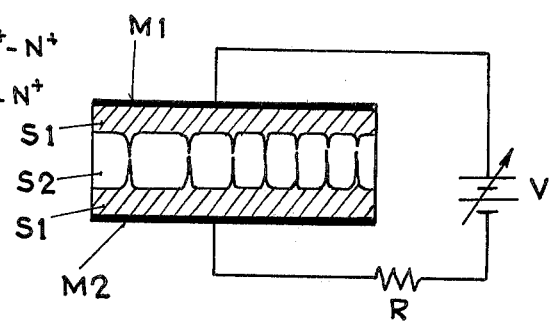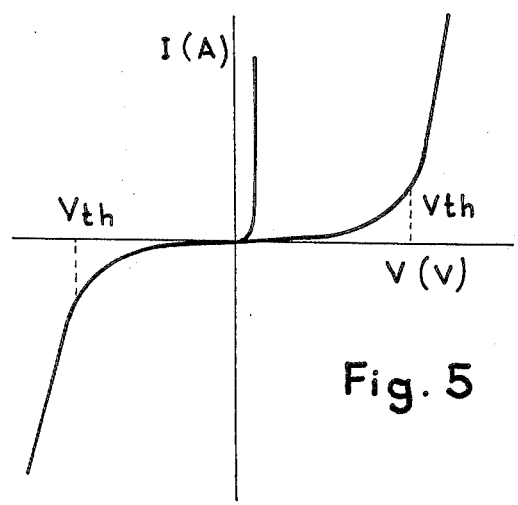

SEMI-CONDUCTOR DEVICE CAPABLE OF SUPPORTING HIGH AMPERAGES OF INVERSE CURRENT

Transient protectors today are mainly prepared from monocrystalline silicon by forming a p-n junction. Under avalanche breakdown conditions the p-n junction diode works in what has been called the zener region, characterized by an almost constant voltage between the electrodes up to very high currents. However when the peak power to be applied to the zener diode reaches the hundreds of watts range, these monocrystalline suppressors become very expensive, and difficult to obtain, due to the large, completely uniform, p-n junction that is necessary.

Any inhomogeneity in the junction may cause microplasma, with a subsequent filamentary breakdown current, that concentrates most of the device current intensity and leads to irreversible damage.

The above, and other, problems explain the use of gas discharge transient protectors and, more recently, ZnO powder ceramic devices. None of the above are suitable for long surge pulses in the kilowatt peak power range.

This invention relates to a semiconductor device of a novel structure and operating characteristics.

The present invention has as its object providing a low cost, reliable, high-power surge arrester.

One of the important features of the present invention is that it makes use of the very high etch pit density semiconductors as they prepared before becoming monocrystalline.

Although the present invention is related to almost any single or compound semiconductor material, henceforth it will be referred to as a silicon device because this material is quite suitable and represents the most economic example of the present invention.

As it is known to those skilled in the art, in the process of obtaining monocrystalline silicon rods, there are three clear steps. Firstly, a silicon-containing compound, such as silicon tetrachloride, trichlorosilane, silane or silicon iodine, is reduced or thermally decomposed to deposit silicon on a heated u-shaped doped monocrystalline silicon rod. Very small Si microcrystallites are then radially deposited on the monocrystalline axis. Secondly, a zone melting process tries to diffuse the dopant through the rod while the monocrystalline grains grow bigger and bigger. Finally, seed and zone melting techniques allow a single rod to be obtained.

In the present invention the starting material is a silicon rod selectively prepared as indicated in the second step above. The silicon rod obtained presents, typically, dislocation lines with an etch pit density in excess of $10^6/cm^2$ and intermediate orientations between < 111 > and < 100 >. This technological process allows the control of the dislocation density or, in other words, the average size of the very small-angle grains. Simultaneously, as it is well known, the original dopant will be present in a higher concentration in these grain boundaries than in the crystal grains themselves.

FIG. 1 shows a schematic cross section of the above quasimonocrystalline material as structural defects are revealed through standard etches (ASTM F47—70 and stirl etch, i.e.). Etch pits (EP) and dislocation lines (DL) are revealed.

From these very high etch pit density silicon rods, wafers are cut, lapped and polished according to the standard silicon technology. The dopant type and concentration in these wafers has been determined in the rod fabrication, as described above.

The devices forming the object of this invention are fabricated from these quazi-monocrystalline wafers by diffusion of an impurity of the opposite type of the wafer background dopant. As it is well known, the diffusion coefficients in the grain boundaries and dislocations are of two orders of magnitude, at least, greater than in monocrystalline grains. The devices obtained have either $p^+$-n, $p^+$-n-$p^+$, $n^+$-p-$n^+$, or $n^+$-p structures, and all have in common the presence of dominant $p^+$-$n^+$ junctions in a prescribed density corresponding to the dislocation density in the silicon rod. Metallic contacts are applied to the device surfaces according to standard semiconductor technology.

FIG. 2 schematically illustrates a device made from p-type quasimonocrystalline silicon and where n-type impurity is diffused. The $p^+$-$n^+$ junctions are shown and metallic ohmic contacts M1 and M2 are also deposited.

FIG. 3 diagrammatically shows another device where the n-type impurity is diffused on both surfaces of the original p-type material. Also the $p^+$-$n^+$ junctions are shown at the multiple defect sites, and at M1 and M2 the metallic contacts are shown.

As it is well known a p-n, n-p-n or p-n-p structure under sufficient reverse applied voltage conditions enters into breakdown avalanche phenomenon. In the device object of the present invention, for example with a n-p-n structure, when a certain voltage is applied, the present multiple $p^+$-$n^+$ junctions enter into avalanche preferentially over other regions of the material. A multiple avalanche breakdown filament device is obtained.

FIG. 4 illustrates the formation of current avalanche channels at the $p^+$-$n^+$ sites when a voltage V is applied to a device of material S1 in which diffusion creates regions S2 of opposite conductivity, and metallic contacts M1 and M2 are provided.

The electrical characteristics shown in FIG. 5 allow the device to work as a transient protector or voltage clipper once the applied voltage reaches the threshold voltage $V_{th}$. The unique material structure of this device clearly avoids any current concentration or device damage even at very high current densities. Another important feature of this device is its superior heat dissipation characteristics due to the good thermal conducting properties of the current filaments. It will be apparent from the foregoing that the novel surge arrester or transient voltage clipper, according to the present invention is a low cost device, because it uses a material of lower cost than monocrystalline silicon, and being purpose-fully a multifilamentar avalanche device, it avoids the problems associated with monocrystalline zener diodes, and has no limitations, if properly constructed, in its transient power clipping capabilities.

What we claim is:

1. A solid-state surge arrester device comprising a quasimonocrystalline semiconductor made up of a plurality of grains, said semiconductor containing a background dopant of one of the two types, n and p, of doping materials, and a layer of diffused dopant of the other type, wherein:
    said semiconductor contains grain boundries in sufficient number and of sufficiently low angle to cause an etch pit density in excess of $10^6/cm^2$;

said grain boundries contain higher concentrations of said dopants than said grains; and said grain boundries form a plurality of $p^+n^+$ junctions.

2. A solid state surge arrester as claimed in claim 1, wherein a majority of said $p^+n^+$ junctions enter into avalanche at a predetermined applied voltage, forming a multiple-path breakdown device.

3. A solid state surge arrester as claimed in claim 1, wherein said background dopant is p-type, and said diffused dopant is n-type.

4. A solid state surge arrester as claimed in claim 1, wherein said background dopant is n-type, and said diffused dopant is p-type.

* * * * *